United States Patent [19]
Hays

[11] Patent Number: 5,866,469
[45] Date of Patent: Feb. 2, 1999

[54] METHOD OF ANODIC WAFER BONDING

[75] Inventor: Kenneth M. Hays, Anaheim, Calif.

[73] Assignee: Boeing North American, Inc., Seal Beach, Calif.

[21] Appl. No.: 662,390

[22] Filed: Jun. 13, 1996

[51] Int. Cl.⁶ ..................................................... H01L 21/46
[52] U.S. Cl. .......................... 438/456; 438/51; 438/455; 148/DIG. 12
[58] Field of Search ..................................... 438/455, 456, 438/50, 51, 52, 53; 148/DIG. 12

[56] References Cited

U.S. PATENT DOCUMENTS

| | | | |
|---|---|---|---|
| 4,802,952 | 2/1989 | Kobori et al. | 438/456 |
| 5,343,064 | 8/1994 | Spangler | 257/350 |
| 5,591,679 | 1/1997 | Jakobsen et al. | 438/456 |

*Primary Examiner*—Trung Dang
*Attorney, Agent, or Firm*—Charles T. Silberberg

[57] ABSTRACT

A process is provided for protecting, containing, and/or completing fragile microelectronic and microelectromechanical (MEM) structures on a low conductivity substrate during anodic wafer bonding of a covering wafer. The wafer includes raised areas that contact the substrate at selected bonding regions to support the wafer as a covering structure over the substrate. The covering wafer includes additional raised areas, such as pillars or posts, that contact selected electric circuit lines on the substrate to form temporary shorts through the wafer. During anodic bonding of the wafer to the substrate, the temporary shorts maintain the connected circuit lines and microstructures at nearly the same electric potential to prevent unwanted arcing and electrostatic forces that could damage the fragile structures. The pillars or posts can be formed at the same time as the raised bonding areas, but on unwanted and otherwise unused portions of the covering wafer. Anodic bonding produces only weak bonds between the wafer posts and the metallic conductor material of the circuit lines. After anodic bonding, the unwanted portions of the covering wafer can be removed to leave covering structures over the selected microstructures. Because of the weak bonds, removal of the unwanted portions of the wafer also removes the posts and eliminates the temporary shorts, with no additional processing needed to electrically separate the circuit lines on the substrate.

15 Claims, 4 Drawing Sheets

METHOD OF ANODIC WAFER BONDING

TECHNICAL FIELD

The present invention relates to wafer bonding during fabrication of microelectronic and microelectromechanical devices and, in particular, to a method of anodic wafer bonding in which temporary shorts are formed to prevent high voltage damage to fragile microstructures.

BACKGROUND OF THE INVENTION

In fabricating microelectronic and microelectromechanical devices, it is sometimes desirable (or necessary) to provide a covering structure or cap to protect, contain, and/or complete the microstructures formed on a substrate. The covering structure or cap can be formed by bonding a second wafer atop the first substrate. The second wafer typically includes raised areas or posts for bonding to certain regions of the first substrate and supporting the second wafer. Selected portions of the top wafer are then removed (by cutting or etching, for example) to leave a covering structure (or structures) over the fragile microstructures.

One method used in the art for bonding wafers is known as anodic bonding. A simplified example of such a process is illustrated schematically in FIGS. 1A and 1B. FIG. 1A is a top plan view of a low-conductivity (or semi-insulating) substrate 12 having various structures, devices, and circuits formed thereon. Substrate 12 may comprise a low-conductivity material, or it may comprise a material that is coated or treated to reduce its conductivity (such as a thermal oxide grown on a silicon wafer substrate, for example). FIG. 1B is a cross section taken at section line 1B—1B in FIG. 1A. In FIG. 1B, a second wafer 14 is shown positioned atop substrate 12. For purposes of illustration only, wafer 14 is transparent in FIG. 1A (i.e., not shown) so that the underlying structures can be viewed. The exemplary structures on substrate 12 include circuit lines 16, 17, and 18, and microelectromechanical (MEM) structure 20 supported by a foundation or base 22 bonded to substrate 12. In this example, circuit line 16 forms an electrical connection to MEM structure 20, circuit line 17 serves as a capacitive pickoff for MEM structure 20, and circuit line 18 is an example of another type of connection or interconnect. Wafer 14 includes raised areas 24 that contact substrate 12 at selected regions 26 and 28 to support wafer 14 above structure 20. During anodic bonding of wafer 14 to substrate 12 at contact regions 26 and 28, an electric potential of several hundred to a few thousand volts (typically on the order of 1000 volts, as shown as an example in FIG. 1B) is applied across substrate 12 and wafer 14. Substrate 12 and wafer 14 may also be externally heated during the process. The high electric potential causes current to flow between substrate 12 and wafer 14, which bonds raised areas 24 of wafer 14 at contact regions 26 and 28 of substrate 12. In general, this process yields different mechanical strengths for bond joints between different materials.

During application of a high electric potential across substrate 12 and wafer 14, undesired arcing and flexing, contact, bonding, or other damage can occur, caused by strong electrostatic attraction between objects, such as fragile structure 20, lines 16, 17, and 18, wafer 14, and substrate 12. To prevent damage to fragile structure 20, circuit lines 16, 17, and 18 can be laid out so that they are joined together by slender conductors, such connector lines 32 and 34. With circuit lines 16, 17, and 18 connected by lines 32 and 34, structure 20 and the circuit lines are all at nearly the same electrical potential during anodic bonding of wafer 14 to low-conductivity substrate 12, thereby preventing arcing and damage to fragile structure 20 or circuit lines 16, 17, and 18.

After wafer 14 has been bonded to substrate 12, unneeded portions of wafer 14 can be removed by sawing, laser cutting, etching, or other techniques, leaving covering structures only over selected structures, such as MEM structure 20, as shown in FIGS. 2A and 2B. For proper operation of MEM structure 20, however, circuit lines 16, 17, and 18 must be disconnected from each other to form discrete conductive paths. This can be accomplished by eliminating connector lines 32 and 34 by laser cutting, sawing, etching, or other techniques, as shown in FIG. 3 where trenches 36 and 38 serve to separate the circuit lines. A useful alternative is to place circuit connectors 32 and 34 at perimeter regions of the chip where they are eliminated when individual chips on the substrate are sawed apart. This embodiment avoids wasting chip surface area with temporary connector lines 32 and 34.

A drawback of the foregoing prior art process is that temporary structures such as connector lines 32 and 34 may not be compatible with operation of the final device, and processing steps are usually required at some stage to eliminate them. Depending on the process used to achieve the separation shown in FIGS. 2A and 2B, the size, materials, or interconnect topography requirements for connectors 32 and 34 may be very inconvenient. In addition, the processing steps needed for circuit separation have a negative impact on cost and device yield. Furthermore, until the temporary shorts are eliminated, multiple objects are shorted together and the device cannot be fully tested or operated for its design use. Therefore, there is a need for improved anodic bonding processes for forming covering structures or caps over fragile microelectronic or microelectromechanical structures.

SUMMARY OF THE INVENTION

The present invention comprises an improved process for protecting fragile microelectronic and microelectromechanical (MEM) structures on a low conductivity substrate during anodic wafer bonding of a covering wafer. The covering wafer includes raised areas that contact the substrate at selected bonding regions to support the wafer as a cover to protect, contain, and/or complete the microstructures formed on a substrate. In the present invention, the covering wafer is formed to include additional raised areas, such as pillars or posts, that contact selected areas of electric circuit lines on the substrate to form temporary shorts through the wafer. During anodic bonding of the covering wafer to the substrate, a high voltage electric potential is applied across the substrate and covering wafer. The high electric potential causes current to flow for bonding the raised areas of the wafer to the regions of contact with the substrate. The temporary shorts maintain the connected circuit lines and microstructures at nearly the same electric potential during anodic bonding of the wafer to the low-conductivity substrate. This prevents unwanted arcing and electrostatic forces that could cause flexing, contact, bonding, or other damage to the fragile structures and circuit lines.

The additional pillars or posts that contact the circuit lines are formed at the same time as the raised bonding areas, but on the unwanted and otherwise unused portions of the covering wafer. The process of anodic bonding produces only weak bonds between the wafer posts and the metallic conductor material of the electric circuit lines. After anodic bonding, the unwanted portions of the covering wafer can be removed by sawing, laser cutting, etching, or other suitable techniques, to leave covering structures over selected microstructures. Because of the weakly bonded temporary contacts of the wafer posts, removal of the unwanted portions of the wafer also removes the posts and eliminates the temporary shorts, all in one step, so that no additional processing is needed to electrically separate the circuit lines on the substrate.

A principal object of the invention is to protect pre-existing fragile structures during anodic wafer bonding. A feature of the invention is the formation of temporary shorts between the covering wafer and electric circuit lines on the substrate. An advantage of the invention is that removal of unwanted portions of the anodically bonded covering wafer also removes the temporary shorts without any additional processing steps.

BRIEF DESCRIPTION OF THE DRAWINGS

For a more complete understanding of the present invention and for further advantages thereof, the following Detailed Description of the Preferred Embodiments makes reference to the accompanying Drawings, in which.

DETAILED DESCRIPTION OF THE PREFERRED EMBODIMENTS

The present invention comprises an improved process for protecting fragile microelectronic and microelectromechanical (MEM) structures during anodic wafer bonding. A simplified example of the present process is illustrated schematically in FIGS. 3 and 4.

Figure 3A:
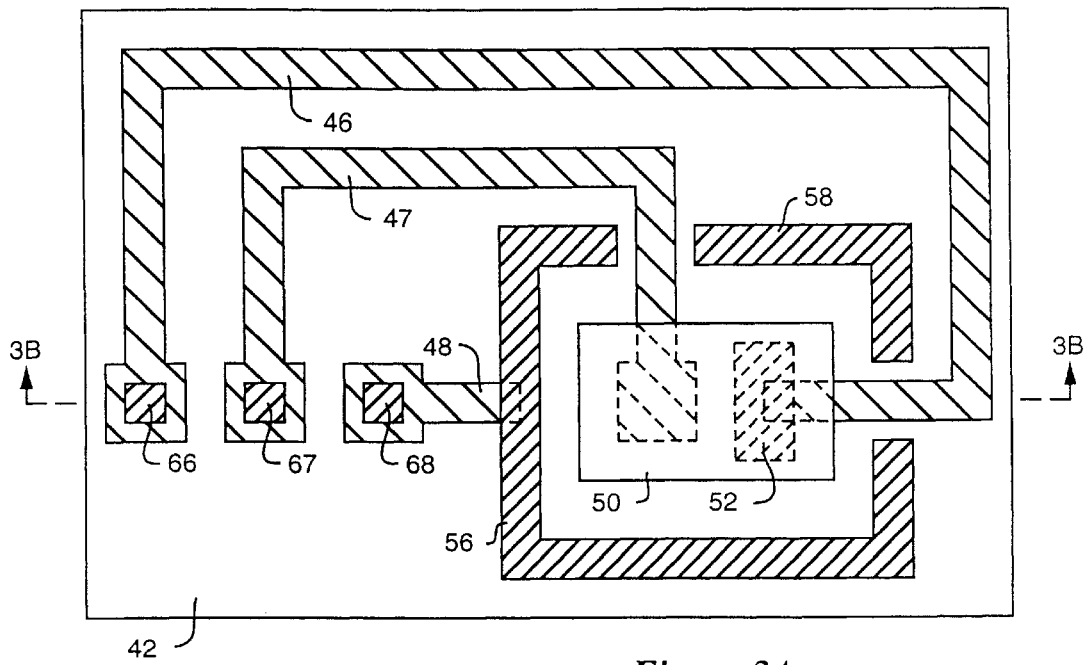
FIG. 3A is a top plan view of a semi-insulating substrate having electronic circuitry, devices, and microstructures formed thereon in accordance with the process of the present invention.
Figure 3B:
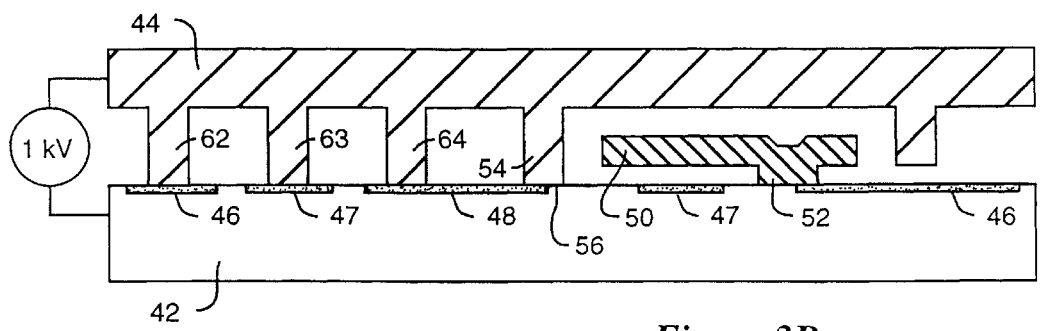
FIG. 3B is a cross section of the substrate and structures of FIG. 3A illustrating anodic bonding of a covering wafer in accordance with the process of the present invention.

FIG. 3A is a top plan view of a low-conductivity substrate 42 having various structures, devices, and circuits formed thereon. Substrate 42 may comprise a semi-insulating material, a low-conductivity material, or a material that is coated or treated to reduce its conductivity (such as a thermal oxide grown on a silicon wafer substrate, for example). FIG. 3B is a cross section taken at section line 3B—3B in FIG. 3A. In FIG. 3B, a second, covering wafer 44 is shown positioned atop substrate 42. Covering wafer 44 may function to protect, contain, and/or complete the various microstructures, devices, and circuits formed on substrate 42. For purposes of illustration only, wafer 44 is transparent in FIG. 3A (i.e., not shown) so that the underlying structures can be viewed. The exemplary structures on substrate 42 include circuit lines 46, 47, and 48, and microelectromechanical (MEM) structure 50 supported by a foundation or base 52 bonded to substrate 42. In this example, circuit line 46 forms an electrical connection to MEM structure 50, circuit line 47 serves as a capacitive pickoff for MEM structure 50, and circuit line 48 represents another type of connection or interconnect. Substrate 42 typically includes many such circuits, devices, and structures. Wafer 44 includes raised areas 54 that contact substrate 42 at selected bonding regions 56 and 58 to support wafer 44 as a covering structure above MEM structure 50. In some embodiments, the raised areas of wafer 44 can totally surround microstructures on substrate 42 to form hermetically sealed caps for the microstructures after anodic bonding of the wafers.

In the process of the present invention, covering wafer 44 is formed to include additional raised areas, such as pillars or posts 62, 63, and 64, that contact selected circuit lines, such as lines 46, 47, and 48 on substrate 42. Posts 62, 63, and 64 are shown to contact circuit lines 46, 47, and 48 at contact regions 66, 67, and 68, respectively, to form temporary shorts connecting circuit lines 46, 47, and 48 through wafer 44. During anodic bonding of wafer 44 to substrate 42 at contact regions 56 and 58, an electric potential of several hundred to a few thousand volts (typically on the order of 1000 volts, as shown as an example in FIG. 3B) is applied across substrate 42 and wafer 44. The high electric potential causes current to flow between substrate 42 and wafer 44, which bonds raised areas 54 of wafer 44 at contact regions 56 and 58 of substrate 42. With circuit lines 46, 47, and 48 connected by temporary shorts through contact regions 66, 67, and 68 and posts 62, 63, and 64, the circuit lines and microstructure 50 are all held at nearly the same electric potential during anodic bonding of wafer 44 to low-conductivity substrate 42. The temporary shorts thus prevent unwanted arcing and electrostatic forces, which might otherwise cause flexing, contact, bonding, or other damage to fragile structures, such as MEM structure 50 and circuit lines 46, 47, and 48.

Figure 1A:
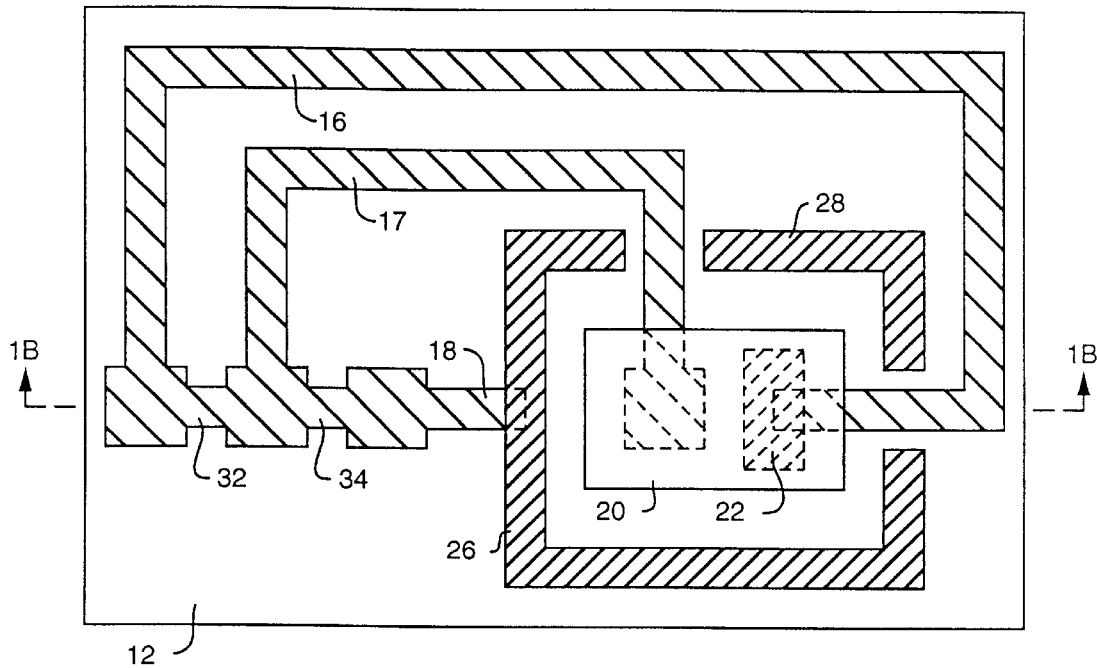
FIG. 1A is a top plan view of a semi-insulating substrate having electronic circuitry, devices, and microstructures formed thereon as is known in the prior art.
Figure 1B:
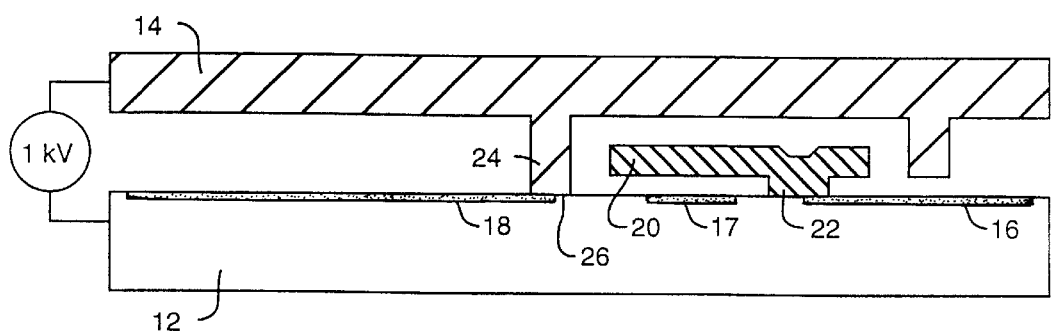
FIGS. 1B is a cross section of the substrate and structures of FIG. 1A illustrating anodic bonding of a second wafer covering the substrate.
Figure 2A:
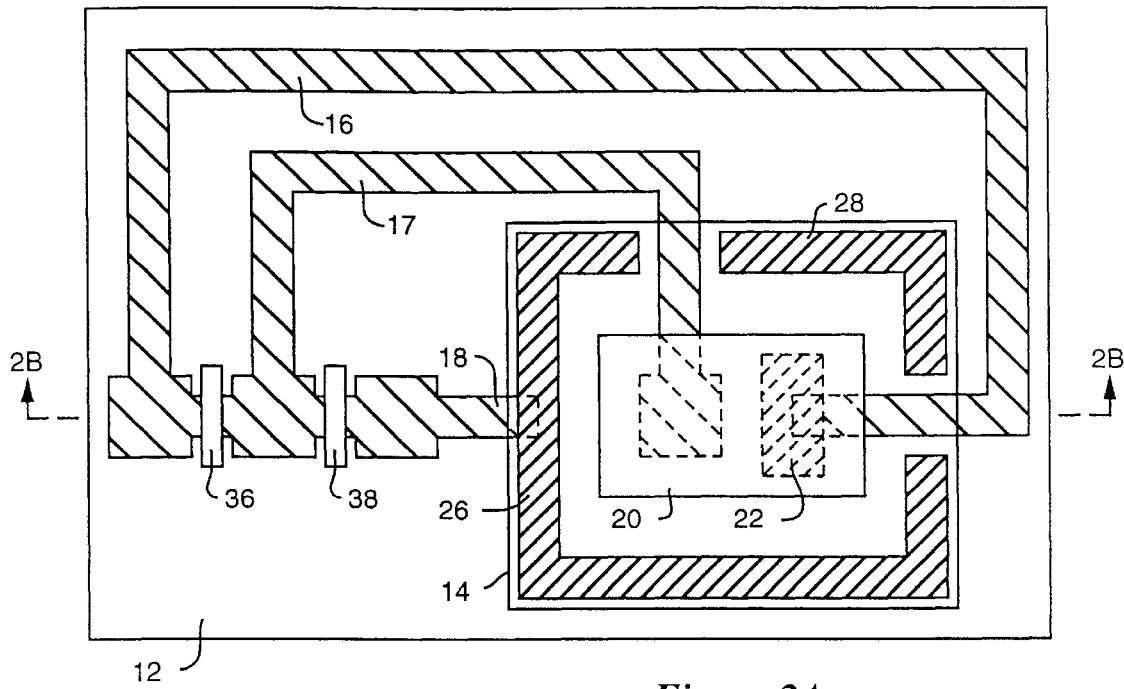
FIGS. 2A and 2B correspond to FIGS. 1A and 1B, respectively, illustrating the removal of unneeded portions of the covering wafer and the severing of protective electrical shorts as performed in the prior art.
Figure 2B:
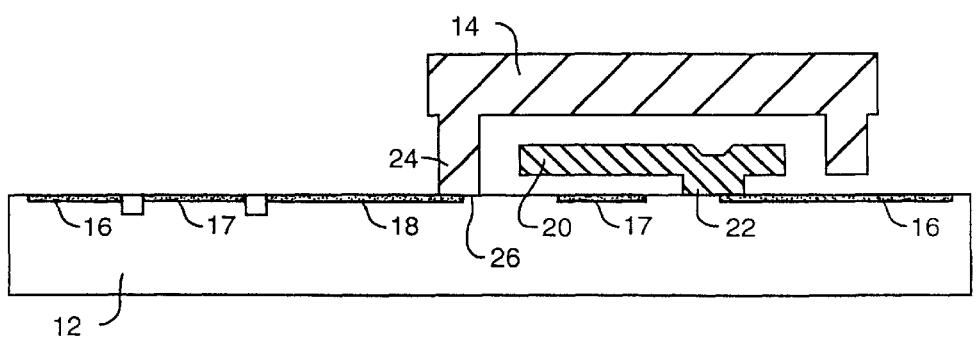

Posts 62, 63, and 64 are formed on the unwanted and otherwise unused portions of covering wafer 44. The formation of posts 62, 63, and 64 on wafer 44 can be accomplished during the same steps used to form raised areas 54 for bonding to regions 56 and 58, so that no additional processing steps are required. The shorts provided by posts 62, 63, and 64 eliminate the need for connector lines 32 and 34, and the subsequent process steps required to remove them, as described above in conjunction with FIGS. 1A and 1B. The process of anodic bonding of wafer 44 to substrate 42 produces only weak bonds between posts 62, 63, and 64 and regions 66, 67, and 68. Anodically bonded contacts to circuit lines 46, 47, and 48, which typically comprise metallic conductors such as gold or other metals, are normally not mechanically strong. An easy way to form a weak contact is to ensure that the entire bond area, such as regions 66, 67, and 68, occurs on the conductor without contacting substrate 42 at any point, as illustrated in FIG. 3A. If the circuit lines required for a particular device are such that contact regions 66, 67, and 68 would produce strong joints during anodic bonding, the conductors can be treated first by surface roughening, coating with a thin layer of a sufficiently conductive material that does not bond well, or other such means to ensure that only weak bonds will be formed.

Figure 4A:
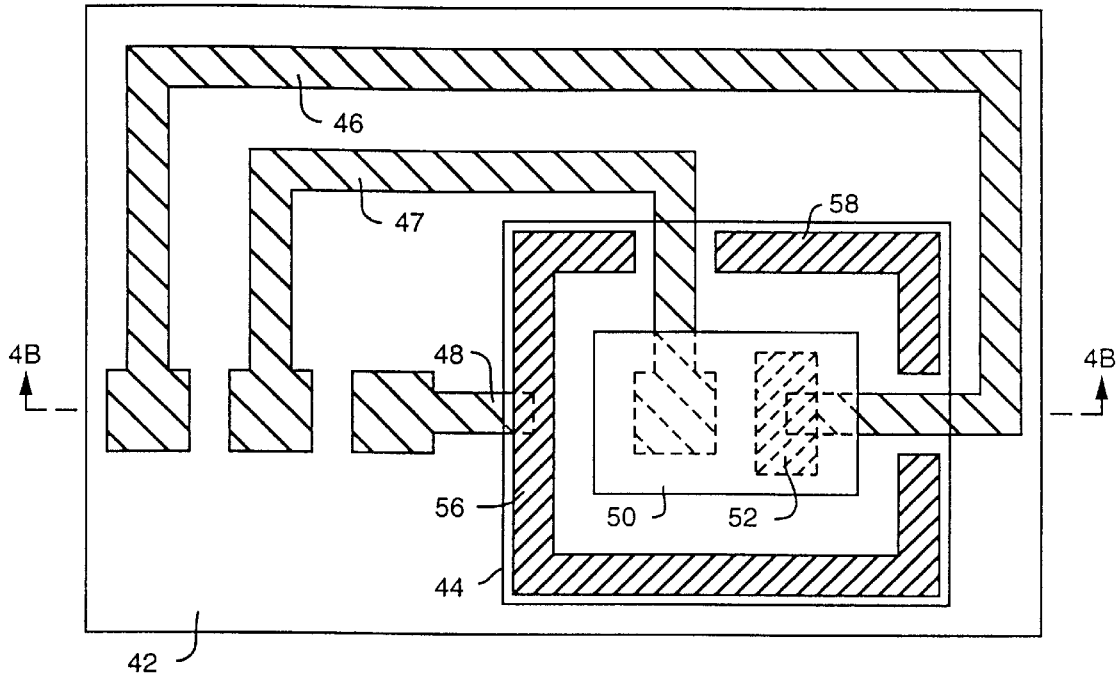
FIGS. 4A and 4B correspond to FIGS. 3A and 3B, respectively, illustrating the removal of the temporary shorts along with the unneeded portions of the covering wafer in accordance with the process of the present invention.
Figure 4B:
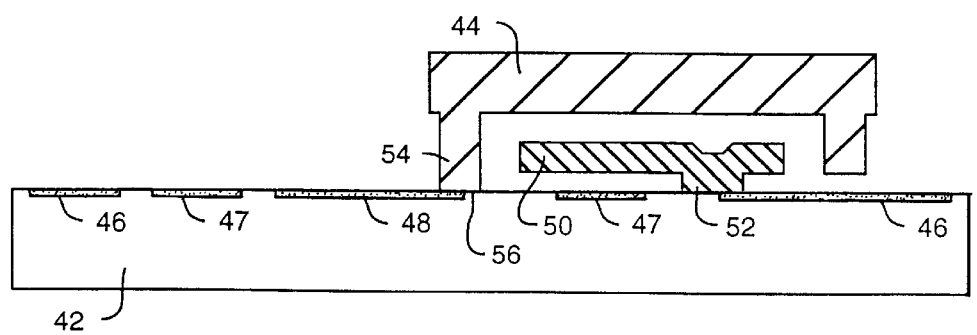

After anodic bonding of wafer 44 to substrate 42, the unwanted portions of wafer 44 can be removed by sawing, laser cutting, etching, or other suitable techniques, as shown in FIGS. 4A and 4B. The remaining covering structure or cap provided by wafer 44 over microstructure 50 is shown in FIG. 4A as being transparent, for purposes of illustration only, to reveal the underlying structures, circuits, and bonded regions. Because of the weakly bonded temporary contacts between posts 62, 63, and 64 and regions 66, 67, and 68, respectively, removal of the unwanted portions of wafer 44 also removes the posts and eliminates the temporary shorts, all in one step, so that no additional processing is needed to electrically separate circuit lines 46, 47, and 48. As a result, the device illustrated in FIGS. 4A and 4B can be fully tested and operated for its design use.

Although the present invention has been described with respect to specific embodiments thereof, various changes and modifications can be carried out by those skilled in the art without departing from the scope of the invention. Therefore, it is intended that the present invention encompass such changes and modifications as fall within the scope of the appended claims.

I claim:

1. A method of anodic wafer bonding, comprising the steps of:

providing a low conductivity substrate having an electric circuit formed thereon;

providing a covering wafer having first and second raised areas;

placing said covering wafer atop said substrate with said first raised area contacting a bonding region of said substrate and said second raised area contacting said electric circuit;

applying a sufficient electric potential across said substrate and said covering wafer for bonding said first raised area of said covering wafer to said bonding region of said substrate;

said second raised area of said covering wafer forming a temporary electric short for maintaining said electric circuit at substantially the same electric potential as said covering wafer; and removing unwanted portions of said covering wafer including said second raised area forming said temporary electric short.

2. The method of claim 1, wherein said step of applying said electric potential does not form a strong bond between said second raised area and said electric circuit.

3. The method of claim 1, wherein said step of providing said substrate includes providing said substrate with a microstructure formed thereon, and said step of removing unwanted portions of said covering wafer includes leaving a covering structure over said microstructure.

4. The method of claim 3, wherein said step of providing said substrate includes providing said electric circuit connected to said microstructure, and said step of forming a temporary electric short includes maintaining said microstructure at substantially the same electric potential as said covering wafer and said electric circuit for preventing damage to said microstructure.

5. The method of claim 3, wherein said step of providing said substrate with said microstructure includes selecting said microstructure from the group consisting of microelectronic structures and microelectromechanical structures.

6. A method of anodic wafer bonding, comprising the steps of:

providing a low conductivity substrate having electric circuit lines formed thereon;

providing a covering wafer having first and second raised areas;

placing said covering wafer atop said substrate with said first raised areas contacting selected bonding regions of said substrate and said second raised areas contacting selected areas of said electric circuit lines;

applying a sufficient electric potential across said substrate and said covering wafer for bonding said first raised areas of said covering wafer to said bonding regions of said substrate;

said second raised areas of said covering wafer forming temporary electric shorts across said contacted circuit lines for maintaining said contacted circuit lines at substantially the same electric potential as said covering wafer; and removing unwanted portions of said bonded covering wafer including said second raised areas forming said temporary electric shorts.

7. The method of claim 6, wherein said step of applying said electric potential does not form strong bonds where said second raised areas contact said electric circuit lines.

8. The method of claim 7, wherein said step of providing said substrate includes providing said substrate with a microstructure formed thereon, and said step of removing unwanted portions of said bonded covering wafer includes leaving a covering structure over said microstructure.

9. The method of claim 8, wherein said step of providing said substrate includes providing at least one of said electric circuit lines connected to said microstructure, and said step of forming temporary electric shorts includes maintaining said microstructure at substantially the same electric potential as said covering wafer and said electric circuit lines for preventing damage to said microstructure during said step of applying said electric potential.

10. The method of claim 9, wherein said step of providing said substrate with said microstructure includes selecting said microstructure from the group consisting of microelectronic structures and microelectromechanical structures.

11. A method of anodic bonding of a covering wafer to a low conductivity substrate, comprising the steps of:

providing a low conductivity substrate having electric circuit lines and at least one microstructure formed thereon, at least one of said electric circuit lines connecting said at least one microstructure;

providing a covering wafer having first and second raised areas for supporting said covering wafer above said substrate and said at least one microstructure;

placing said covering wafer atop said substrate with said first raised areas contacting selected bonding regions of said substrate and said second raised areas contacting selected areas of said electric circuit lines;

applying a sufficiently high electric potential across said substrate and said covering wafer for bonding said first raised areas of said covering wafer to said bonding regions of said substrate;

said second raised areas of said covering wafer forming temporary electric shorts across said contacted circuit lines for maintaining said circuit lines and said at least one microstructure at substantially the same electric potential as said covering wafer; and removing unwanted portions of said bonded covering wafer including said second raised areas forming said temporary electric shorts.

12. The method of claim 11, wherein said step of applying said high electric potential does not form strong bonds where said second raised areas contact said electric circuit lines.

13. The method of claim 12, wherein said step of removing unwanted portions of said bonded covering wafer includes leaving a covering structure over said at least one microstructure.

14. The method of claim 13, wherein said step of forming temporary electric shorts prevents damage to said at least one microstructure during said step of applying said high electric potential.

15. The method of claim 14, wherein said step of providing said substrate with said at least one microstructure includes selecting said microstructure from the group consisting of microelectronic structures and microelectromechanical structures.

* * * * *